(12) United States Patent
Matsumura

(10) Patent No.: US 8,708,021 B2
(45) Date of Patent: Apr. 29, 2014

(54) HEATING APPARATUS AND IMPLEMENTED BODY MANUFACTURING METHOD

(75) Inventor: Takashi Matsumura, Tochigi (JP)

(73) Assignee: Dexerials Corporation, Tokyo (JP)

( * ) Notice: Subject to any disclaimer, the term of this patent is extended or adjusted under 35 U.S.C. 154(b) by 12 days.

(21) Appl. No.: 13/552,638

(22) Filed: Jul. 19, 2012

(65) Prior Publication Data

US 2012/0279653 A1 Nov. 8, 2012

Related U.S. Application Data

(63) Continuation of application No. PCT/JP2011/000077, filed on Jan. 11, 2011.

(30) Foreign Application Priority Data

Jan. 22, 2010 (JP) ................................ 2010-012426

(51) Int. Cl.
| | |
|---|---|
| B32B 37/10 | (2006.01) |
| B29C 65/02 | (2006.01) |
| B30B 15/34 | (2006.01) |
| B29C 65/00 | (2006.01) |
| B30B 15/06 | (2006.01) |

(52) U.S. Cl.
CPC ........... B29C 66/8161 (2013.01); B29C 65/002 (2013.01); B29C 66/824 (2013.01); B32B 37/10 (2013.01); B30B 15/061 (2013.01); B30B 15/064 (2013.01); B32B 2457/00 (2013.01)
USPC ........................................ 156/583.3; 100/260

(58) Field of Classification Search
CPC .. B29C 66/824; B29C 66/8161; B29C 65/02; B32B 37/10; B32B 2457/00; B30B 15/061; B30B 15/062; B30B 15/064
USPC .......... 156/583.1, 583.2, 583.3, 583.4, 583.6, 156/583.7, 583.9, 583.91; 100/260, 261, 100/265–268
See application file for complete search history.

(56) References Cited

U.S. PATENT DOCUMENTS

| | | | | |
|---|---|---|---|---|
| 4,806,195 | A | * | 2/1989 | Namysl .......................... 156/382 |
| 5,800,667 | A | * | 9/1998 | Kosaki et al. ................... 156/382 |

(Continued)

FOREIGN PATENT DOCUMENTS

| | | |
|---|---|---|
| JP | H06-252210 A | 9/1994 |
| JP | 3893930 B2 | 3/2007 |

(Continued)

OTHER PUBLICATIONS

International Search Report for International application No. PCT/JP2011/000077 mailed on Feb. 8, 2011.

(Continued)

*Primary Examiner* — Scott W Dodds

(57) ABSTRACT

To improve the tact time of a heating apparatus, provided is a heating apparatus comprising a first pressing member that heats a heating target; a second pressing member that includes an elastic body, and sandwiches the heating target between the first pressing member and the elastic body; and a floating jig that thermally separates the first pressing member from the heating target, holds the heating target between the first pressing member and the second pressing member, and when one of the first pressing member and the second pressing member presses the heating target toward the other of the first pressing member and the second pressing member, thermally connects the heating target and the first pressing member.

13 Claims, 6 Drawing Sheets

(56) References Cited

U.S. PATENT DOCUMENTS

| | | | |
|---|---|---|---|
| 6,149,757 A * | 11/2000 | Chikaki et al. | 156/286 |
| 7,087,138 B2 * | 8/2006 | Chen | 156/583.1 |
| 2008/0035274 A1 * | 2/2008 | Kanisawa | 156/583.1 |
| 2009/0032570 A1 | 2/2009 | Matsumura | |
| 2012/0247664 A1 * | 10/2012 | Kobayashi | 156/285 |

FOREIGN PATENT DOCUMENTS

| | | |
|---|---|---|
| JP | 3921459 B2 | 5/2007 |
| JP | 2007-189100 A | 7/2007 |
| JP | 2008-159961 A | 7/2008 |
| WO | 2007/080956 A1 | 7/2007 |

OTHER PUBLICATIONS

Translation of International Preliminary Report on Patentability for application PCT/JP2011/000077 with a mailing date of Sep. 13, 2012.

* cited by examiner

HEATING APPARATUS AND IMPLEMENTED BODY MANUFACTURING METHOD

The contents of the following patent applications are incorporated herein by reference:
NO. JP 2010-012426 filed on Jan. 22, 2010 and
NO. PCT/JP2011/000077 filed on Jan. 11, 2011.

BACKGROUND

1. Technical Field

The present invention relates to a heating apparatus and a implemented body manufacturing method.

2. Related Art

When electrically connecting electronic components to a substrate, a pressure bonding apparatus is used that includes a platform and a pressing head, and the pressure bonding apparatus heats the substrate and electronic components arranged on the platform while pressing with the pressing head (for example, see Patent Documents 1 and 2).
Patent Document 1: Japanese Patent Application Publication No. 2007-189100
Patent Document 2: Japanese Patent Application Publication No. H6-252210

When the set temperature at the start of the pressure bonding process differs from the set temperature during the pressure bonding process or at the end of the pressure bonding process, in order to perform the above pressure bonding in series, it is necessary to cool the platform after the above pressure bonding and before the next pressure bonding process, and to then raise the temperature of the platform again after beginning the next pressure bonding process. Therefore, the tact time is increased. Accordingly, it is an object of an aspect of the innovations herein to provide a heating apparatus and an implemented body manufacturing method, which are capable of overcoming the above drawbacks accompanying the related art. The above and other objects can be achieved by combinations described in the independent claims. The dependent claims define further advantageous and exemplary combinations of the innovations herein.

SUMMARY

According to a first aspect related to the innovations herein, provided is a heating apparatus comprising a first pressing member that heats a heating target; a second pressing member that includes an elastic body, and sandwiches the heating target between the first pressing member and the elastic body; and a floating jig that thermally separates the first pressing member from the heating target, holds the heating target between the first pressing member and the second pressing member, and when one of the first pressing member and the second pressing member presses the heating target toward the other of the first pressing member and the second pressing member, thermally connects the heating target and the first pressing member.

The heating apparatus may further comprise a heating section that heats the first pressing member and keeps the first pressing member at a predetermined temperature. In the heating apparatus, when the pressing force by the first pressing member or the second pressing member is removed, the floating jig may thermally separate the first pressing member from the heating target. In the heating apparatus, the floating jig may mechanically separate the heating target from the first pressing member, according to one of the first pressing member and the second pressing member separating from the other.

In the heating apparatus, the elastic body of the second pressing member may press an electronic component of the heating target, which is formed by layering the substrate, the adhesive layer, and the electronic component in the stated order, against the substrate. In the heating apparatus, the elastic body of the second pressing member may press a plurality of the electronic components of the heating target, which is formed by layering the substrate, the adhesive layer, and the electronic components in the stated order, against the substrate. The heating apparatus may further comprise a plurality of carriers on which the heating target is mounted; and a transporting section that sequentially selects the carriers and causes the floating jig to hold the selected carriers.

According to a second aspect related to the innovations herein, provided is a method for manufacturing an implemented body, comprising thermally separating a heating target, which is formed by layering a substrate, an adhesive layer, and an electronic component in the stated order, from a first pressing member that heats the heating target and holding the heating target between the first pressing member and an elastic body of a second pressing member; and thermally connecting the heating target and the first pressing member by causing one of the first pressing member and the second pressing member to press the heating target toward the other of the first pressing member and the second pressing member.

The method for manufacturing an implemented body may further comprise thermally separating the first pressing member from the heating target, by removing pressing force applied to the heating target by the first pressing member or the second pressing member. The method for manufacturing an implemented body may further comprise, prior to thermally connecting the heating target and the first pressing member, heating the first pressing member to a temperature that causes thermosetting of the adhesive layer and maintaining the first pressing member at the temperature.

The summary clause does not necessarily describe all necessary features of the embodiments of the present invention. The present invention may also be a sub-combination of the features described above.

DESCRIPTION OF EXEMPLARY EMBODIMENTS

Figure 1:
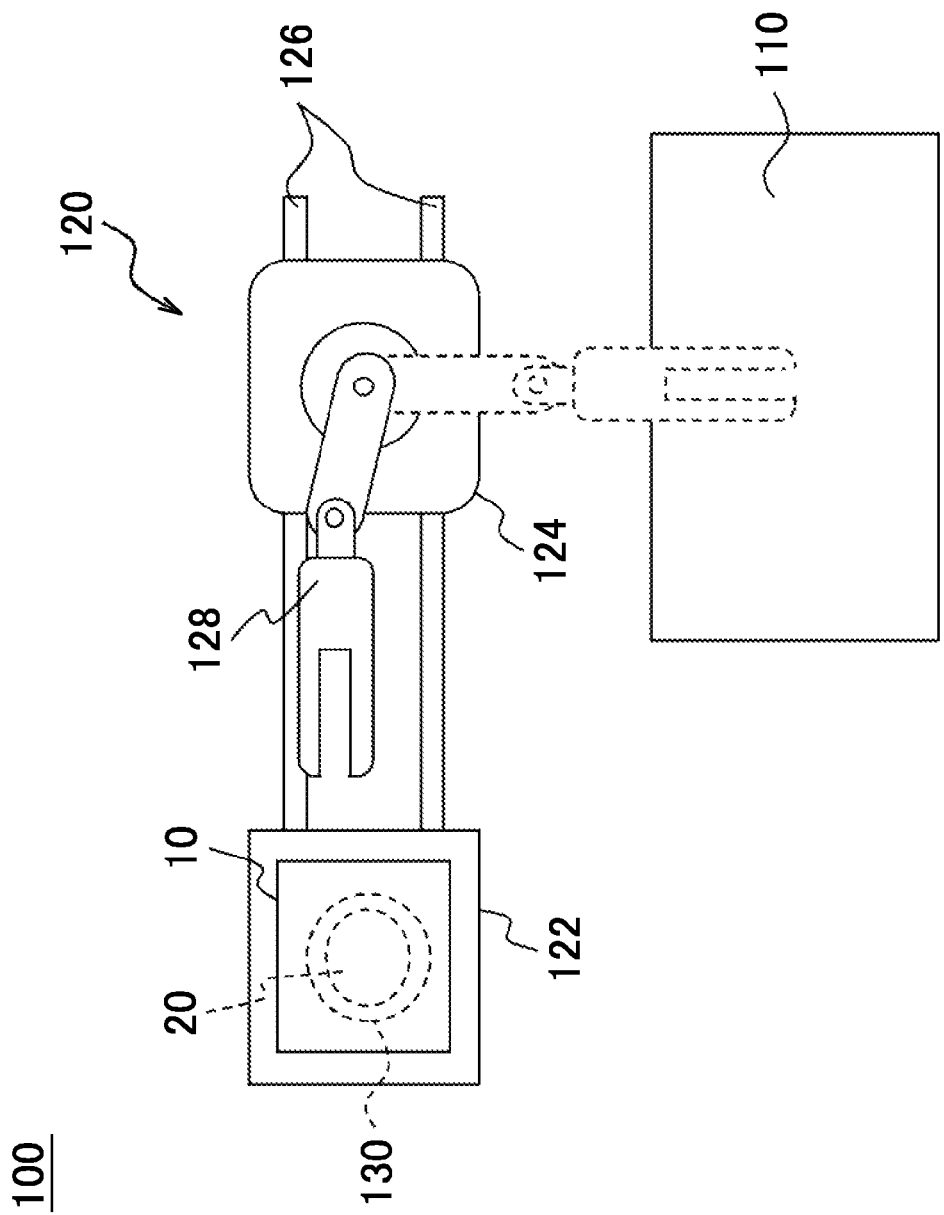
FIG. 1 schematically shows an exemplary top surface of the mounting device 100.

Hereinafter, some embodiments of the present invention will be described. The embodiments do not limit the invention according to the claims, and all the combinations of the features described in the embodiments are not necessarily essential to means provided by aspects of the invention.

The following references the drawings to describe embodiments. In the drawings, components that are the same or similar to each other are given the same reference numerals, and redundant explanations are omitted. The drawings are schematic representations, and do not necessarily represent the actual dimensions or proportions. Furthermore, for ease of explanation, different drawings may show portions using different dimensional relationships and proportions.

FIG. 1 schematically shows an exemplary top surface of the mounting device 100. The mounting device 100 implements an electronic component, such as an IC, LSI, resistor, wire, or another substrate, on a substrate. The mounting device 100 includes a heating unit 110 and a transport unit 120. The mounting device 100 may include a plurality of transport carriers 130. The mounting device 100 and the heating unit 110 may be examples of a heating apparatus. The transport unit 120 may be an example of a transporting section. The transport carrier 130 may be an example of a carrier.

The heating unit 110 heats a workpiece 20. The heating unit 110 may heat a workpiece 20 that is formed by layering the substrate, the adhesive layer, and the electronic component in the stated order, while pressing the workpiece 20, thereby implementing the electronic component on the substrate. The heating unit 110 may implement a plurality of electronic components on the substrate using the same process. The workpiece 20 may be an example of a heating target.

The transport unit 120 transports the workpiece 20 to the heating unit 110. The transport unit 120 may transport the transport carrier 130 with the workpiece 20 mounted thereon to the heating unit 110. The transport unit 120 may sequentially select a plurality of transport carriers 130 housed in a cassette 10, and sequentially transport these transport carriers 130 to the heating unit 110.

The transport unit 120 includes a loader section 122, a moving section 124, and rails 126. The cassette 10 storing the transport carriers 130 is mounted on the loader section 122. The moving section 124 runs on the rails 126 to pass the transport carriers 130 between the heating unit 110 and the loader section 122. The moving section 124 includes a robot arm 128. The robot arm 128 takes transport carriers 130 out of the cassette 10. The robot arm 128 stores transport carriers 130 in the cassette 10.

The transport carrier 130 includes a flat surface on which the workpiece 20 can be mounted. Each transport carrier 130 may be a metal plate. The material for the transport carriers 130 may be stainless steel, copper, aluminum, copper alloy, aluminum alloy, or alloy steel, for example. The heat transfer coefficient of the transport carrier 130 may be greater than that of the workpiece 20. The present embodiment describes a case in which transport carriers 130 housed in the cassette 10 are carried to the mounting device 100. However, the transport carriers 130 are not limited to this. For example, transport carriers 130 with workpieces 20 mounted thereon may be sequentially carried to the mounting device 100.

Figure 2:
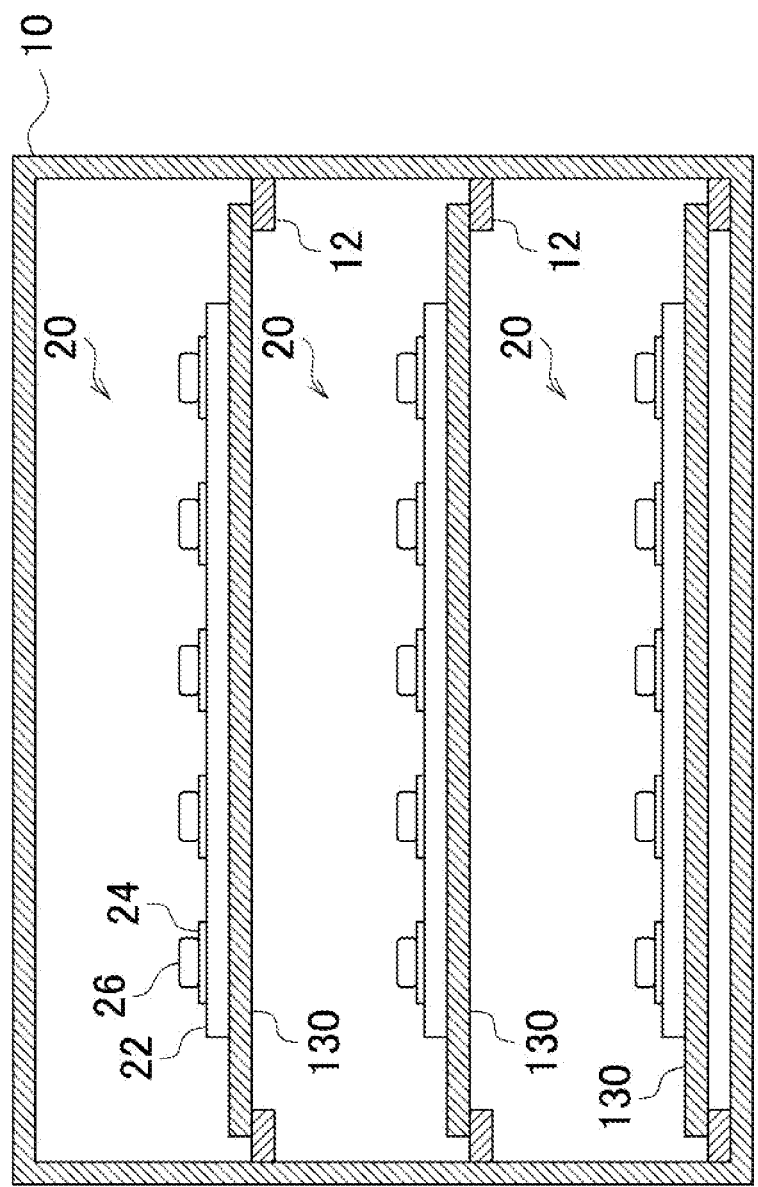
FIG. 2 schematically shows an exemplary cross section of the cassette 10.

FIG. 2 schematically shows an exemplary cross section of the cassette 10. The cassette 10 includes a plurality of mounting members 12 that support the transport carriers 130. In the present embodiment, the cassette 10 houses a plurality of transport carriers 130 on which are respectively mounted a plurality of workpieces 20.

Each workpiece 20 includes a substrate 22, an adhesive layer 24, and an electronic component 26. The workpiece 20 may be formed by layering the substrate 22, the adhesive layer 24, and a plurality of the electronic components 26 in the stated order. The substrate 22 may be a printed circuit board, a multilayer circuit substrate, a flexible substrate, or a glass substrate, for example. The electronic components 26 may be tentatively pressure bonded to the substrate 22. The conditions for the tentative pressure bonding may be a temperature from 40° C. to 90° C., pressure from 0.3 MPa to 3 MPa, and pressing time from 0.3 seconds to 10 seconds.

The adhesive layer 24 adheres the electronic components 26 to the substrate 22. The adhesive layer 24 may include at least one of a thermosetting resin and a thermoplastic resin. The adhesive layer 24 may include a film-forming resin, a liquid hardening component, and a hardening agent. The film-forming resin may be a phenoxy resin, a polyester resin, a polyamide resin, or a polyimid resin, for example. When considering marketplace availability and connection reliability, phenoxy resin is preferable.

The liquid hardening component may include liquid epoxy resin or acrylate, for example. When considering connection reliability and stability of the hardened substance, the liquid hardening component preferably includes two or more functional groups. If the liquid hardening component is a liquid epoxy resin, the hardening agent may be imidazole, amino acid, sulfonium salt, or onium salt, for example. If the liquid hardening component is acrylate, the hardening agent may be an organic oxide compound, for example.

The adhesive layer 24 may include an additive such as various types of rubber components, softening agents, and various types of fillers, and may also include conductive particles. The adhesive layer 24 may be an adhesive agent formed as a paste or an adhesive film formed as a sheet. The adhesive layer 24 may be an NCF (Non-Conductive Film) or an ACF (Anisotropic Conductive Film).

Figure 3:
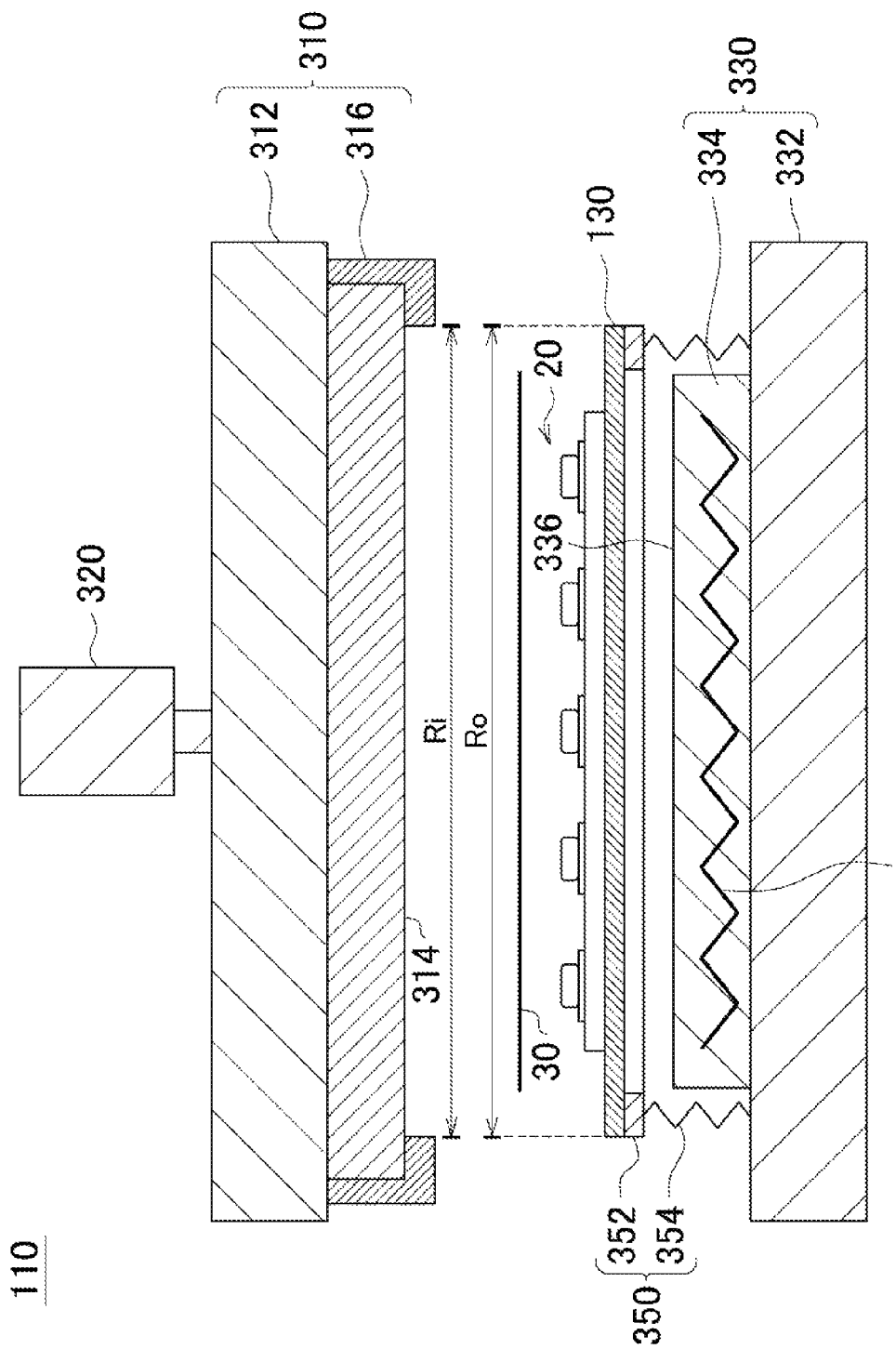
FIG. 3 schematically shows an exemplary cross section of the heating unit 110, when a workpiece 20 and a stage 330 are thermally separated from each other.

FIG. 3 schematically shows an exemplary cross section of the heating unit 110, when a workpiece 20 and a stage 330 are thermally separated from each other. The heating unit 110 includes a head 310, a drive section 320, a stage 330, a heater 340, and a floating jig 350. The heating unit 110 sandwiches the workpiece 20 between the head 310 and the stage 330, and heats the workpiece 20. In this way, the electronic components 26 can be implemented on the substrate 22.

The heating unit 110 may sandwich a protective film 30 between the head 310 and the workpiece 20, and heat the workpiece 20. The protective film 30 prevents the adhesive layer 24 from sticking to the pressing member 314. The protective film 30 is not particularly limited, but preferably has heat resistant properties and can be peeled off of the adhesive layer 24. The material of the protective film 30 may be polytetrafluoroethylene or silicon rubber, for example.

The head 310 includes a head body 312, a pressing member 314, and a holding member 316. The head 310 presses the electronic components 26 of the workpiece 20 against the substrate 22, using the pressing member 314. The head 310 may press a plurality of electronic components 26 of the workpiece 20 against the substrate 22 at the same time, using the pressing member 314. The head 310 may be an example of a second pressing member.

The head body 312 presses the pressing member 314 toward the stage 330. The head body 312 sandwiches the workpiece 20 between the pressing member 314 and the stage 330, and is rigid enough to not deform when the workpiece 20 is pressed toward the stage 330. The head body 312 may be made of metal such as iron or stainless steel. The head body 312 may include a heater, for example.

The pressing member 314 is arranged between the head body 312 and the workpiece 20. The pressing member 314 may be a material with higher elasticity than the head body 312. The pressing member 314 may be an elastomer such as natural rubber, synthetic rubber, or silicon rubber. The pressing member 314 may be an example of an elastic body.

In this way, when the electronic components 26 are implemented on the substrate 22, positional skewing of the electronic components 26 can be restricted. Furthermore, even when a plurality of types of electronic components 26 having different heights are implemented on the substrate 22, all of the electronic components 26 can be pressed against the substrate 22.

The holding member 316 holds the pressing member 314 on the surface of the head body 312 on the stage 330 side. The holding member 316 may hold an edge portion of the pressing member 314. The holding member 316 may include a ring-shaped or frame-shaped member that holds the edge portion of the pressing member 314. The shape of the pressing member 314 exposed by the holding member 316 may be substantially the same as the shape of the transport carrier 130.

For example, when the transport carrier 130 is a circular metal plate with an outer diameter Ro and the holding member 316 holds the edge portion of the pressing member 314 with a ring-shaped member having an inner diameter Ri, the inner diameter Ri may be slightly larger than the outer diameter Ro. In this way, the workpiece 20 can be firmly pressed. As a result, positional skew of the electronic components 26 can be restricted.

The drive section 320 moves the head 310 toward the stage 330, using an air cylinder, hydraulic cylinder, or servo motor, for example. In the present embodiment, the drive section 320 moves the head 310 up and down to apply and remove a pressing force on the workpiece 20 and the transport carrier 130 via the head 310. The present embodiment describes an example in which the drive section 320 moves the head 310 toward the stage 330, but the drive section 320 is not limited to this. Instead, the drive section 320 may move the stage 330 toward the head 310.

The stage 330 includes a platform 332 and a heating stage 334. The platform 332 may have a substantially horizontal surface. A heating stage and a floating jig 350 may be arranged on the horizontal surface of the platform 332. The stage 330 may be an example of a first pressing member.

The heating stage 334 heats the workpiece 20. The heating stage 334 may heat the workpiece 20 via the transport carrier 130. The heating stage 334 may have a heated surface 336 that is substantially horizontal. The heated surface 336 may be larger than the workpiece 20. The heated surface 336 may be smaller than the transport carrier 130. The heating stage 334 may be an example of a first pressing member.

The heater 340 is arranged within the heating stage and heats the heating stage 334. The heater 340 may keep the heating stage 334 at a predetermined temperature. The heater 340 may be an example of a heating section. In this way, even when heating a plurality of workpieces 20 in series, the heater 340 can shorten the tact time. Furthermore, compared to a case in which the heating stage 334 is heated quickly, the heating capability of the heater 340 can be lower.

The floating jig 350 holds the workpiece 20 between the head 310 and the heating stage 334. The floating jig 350 may include a holding member 352 and a raising/lowering member 354.

The holding member 352 receives the transport carrier 130 from the transport unit 120. The holding member 352 holds the transport carrier 130 between the head 310 and the heating stage 334. The holding member 352 is supported by the raising/lowering member 354, and can move up and down in FIG. 3.

In this way, the holding member 352 thermally separates the heating stage 334 from the workpiece 20, and can hold the workpiece 20 between the head 310 and the heating stage 334. Here, the state of the heating stage 334 and the workpiece 20 being thermally separated from each other does not refer only to a state in which thermal conduction between the heating stage 334 and the workpiece 20 is completely cut off, but also to a state in which thermal conduction between the heating stage 334 and the workpiece 20 is restricted relative to a state in which the heating stage 334 and the workpiece 20 are thermally connected by the heating unit 110.

The holding member 352 may hold the edge portion of the transport carrier 130. The holding member 352 may have a ring shape or a frame shape. The size of the transport carrier 130 exposed by the holding member 352 may be substantially the same as or greater than the size of the heated surface 336.

In this way, the heated surface 336 and the transport carrier 130 can be brought into contact with each other, to thermally connect the workpiece 20 and the heating stage 334. Since the holding member 352 and the heated surface 336 do not contact each other, the temperature increase of the holding member 352 can be restricted. Since the thermal capacity of the holding member 352 is less than in a case where the holding member 352 is shaped as a plate, the temperature increase of the workpiece 20 can be restricted while the heating stage 334 is kept thermally separated from the workpiece 20. Furthermore, when the heated surface 336 and the transport carrier 130 are in contact with each other, the transport carrier 130 can cut off the heat from the heated surface 336.

The holding member 352 is not limited to the shape described above. For example, the holding member 352 may be formed as a plate and the transport carrier 130 may be held on the holding member 352. Furthermore, the workpiece 20 and the heating stage 334 may be thermally connected by bringing the holding member 352 and the heated surface 336 into contact with each other.

When the drive section 320 moves the head 310 toward the stage 330, the raising/lowering member 354 moves the holding member 352 in the direction in which the head 310 moves. When the drive section 320 moves the stage 330 toward the head 310, the raising/lowering member 354 moves the holding member 352 in a direction opposite the direction in which the stage 330 moves.

In this way, when one of the head 310 and the heating stage 334 presses the workpiece 20 toward the other, the raising/lowering member 354 thermally connects the workpiece 20 and the heating stage 334. When the pressing force by the head 310 or the heating stage 334 is removed, the raising/lowering member 354 thermally separates the heating stage 334 and the workpiece 20.

The raising/lowering member 354 may mechanically separate the workpiece 20 mounted on the transport carrier 130 from the heating stage 334, in accordance with the separation of one of the head 310 and the heating stage 334 from the other. The raising/lowering member 354 may be an air cylinder, a hydraulic cylinder, a servo motor, or an elastic body such as a spring or elastomer, for example. The raising/lowering member 354 may include a pressure detector that detects pressure applied to the holding member 352 or the raising/lowering member 354.

In this way, even when a plurality of workpieces 20 are heated in series, there is no need to cool and heat the heating stage 334 every time a workpiece 20 is processed. As a result, the tact time of the workpiece 20 can be shortened. Furthermore, a heater with low heating capability can be used, and a cooling device can be omitted.

For example, when an adhesive layer 24 including a thermosetting resin is used to mount the electronic components 26 on the substrate 22, the heater 340 adjusts the temperature of the heating stage 334 to be approximately 180° C. Therefore, the temperature of the heating stage 334 when the heating of the workpiece 20 is finished is approximately 180° C.

If the temperature of the adhesive layer 24 exceeds a range from 40° C. to 60° C., thermosetting of the adhesive layer 24 is encouraged. Therefore, when the next workpiece 20 is mounted on the heated surface 336 while the temperature of the heating stage 334 is high, hardening of the adhesive layer 24 progresses before the head 310 and the stage 330 press the workpiece 20, and therefore it is difficult to mount the electronic components 26 on the substrate 22.

However, using the floating jig 350 enables the workpiece 20 to be held while keeping the heating stage 334 thermally separated from the workpiece 20. Therefore, the electronic components 26 can be mounted on the substrate 22 without cooling the heating stage 334 to a temperature range from 40° C. to 60° C. every time a workpiece 20 is processed.

Figure 4:
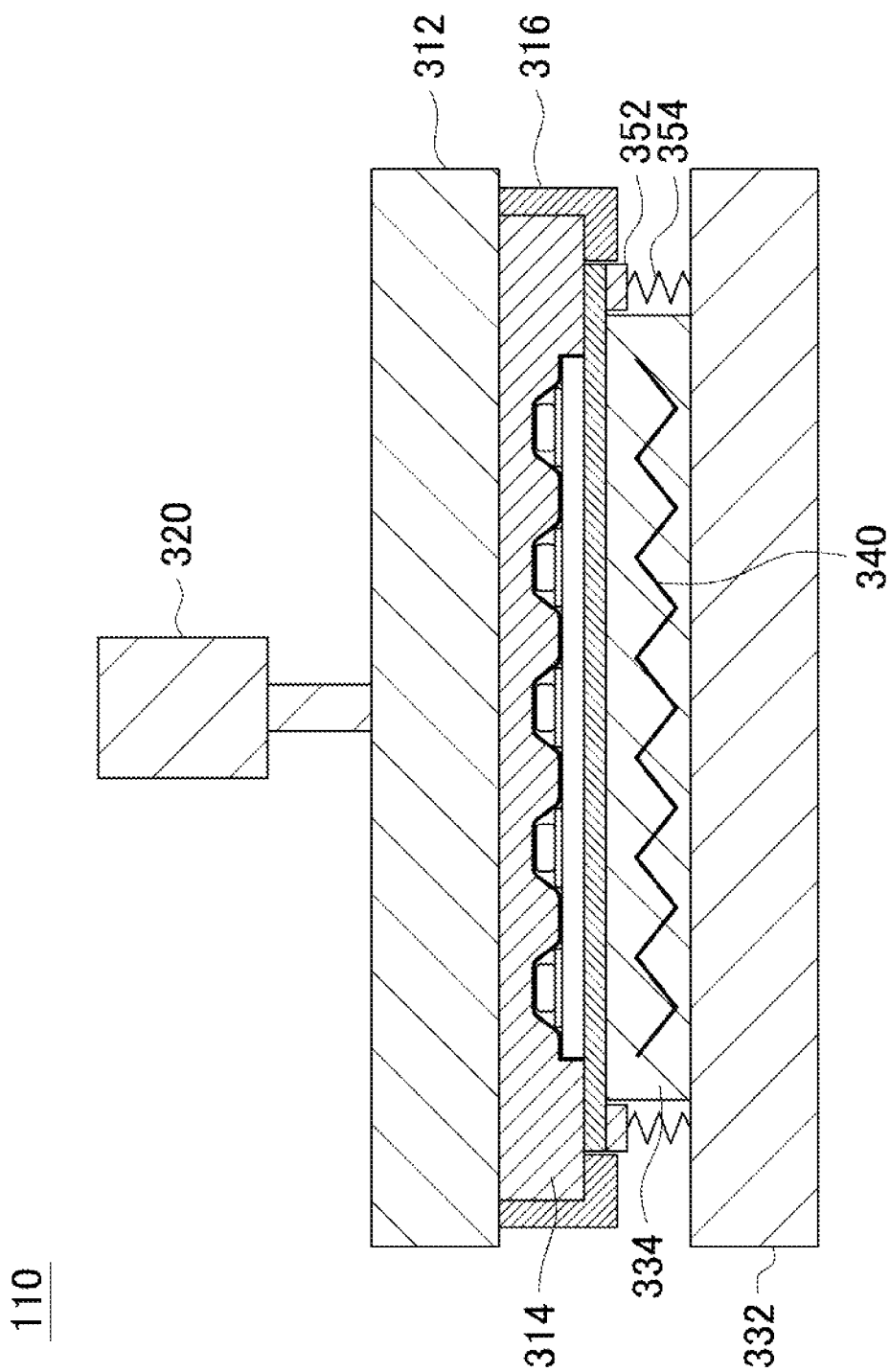
FIG. 4 schematically shows an exemplary cross section of the heating unit 110, in a state where the workpiece 20 and the stage 330 are thermally connected.

FIG. 4 schematically shows an exemplary cross section of the heating unit 110, in a state where the workpiece 20 and the stage 330 are thermally connected. An exemplary operation of the heating unit 110 is described using FIG. 4. When the workpiece 20 is mounted on the floating jig 350, the drive section 320 moves the head 310 toward the stage 330. The head 310 is gradually lowered to press the protective film 30, the workpiece 20, and the transport carrier 130.

When the head 310 presses the workpiece 20 and the transport carrier 130 toward the stage 330, a pressing force is applied to the floating jig 350 by the head 310, and the raising/lowering member 354 lowers the workpiece 20, the transport carrier 130, and the holding member 352. In the present embodiment, the head 310 is lowered in a manner such that the holding member 316 of the head 310 covers the holding member 352 of the floating jig 350. In this way, positional skew of the floating jig 350 in the horizontal direction can be restricted.

The head 310 is further lowered, thereby brining the transport carrier 130 into contact with the heated surface 336 of the heating stage 334. In this way, the workpiece 20 can be heated while the workpiece 20 is pressed by the pressing member 314 and the heating stage 334. In this way, the electronic components 26 are pressure-bonded to the substrate 22, and the electrodes of the substrate 22 are electrically connected to the electrodes of the electronic components 26. As a result, good connection reliability is achieved. At this time, the adhesive layer 24 can stabilize the positions of the electronic components 26. The adhesive layer 24 can also restrict mixing of moisture or foreign objects into the regions between the electrodes of the substrate 22 and the electrodes of the electronic components 26.

When processing of the workpiece 20 is finished, the drive section 320 moves the head 310 upward. When the head 310 is moved upward, the raising/lowering member 354 no longer receives the pressing force from the head 310. Therefore, the raising/lowering member 354 moves the holding member 352 upward. As a result, the transport carrier 130 and the heating stage 334 are physically separated from each other, and the workpiece 20 and the heating stage 334 are thermally separated from each other.

Figure 5:
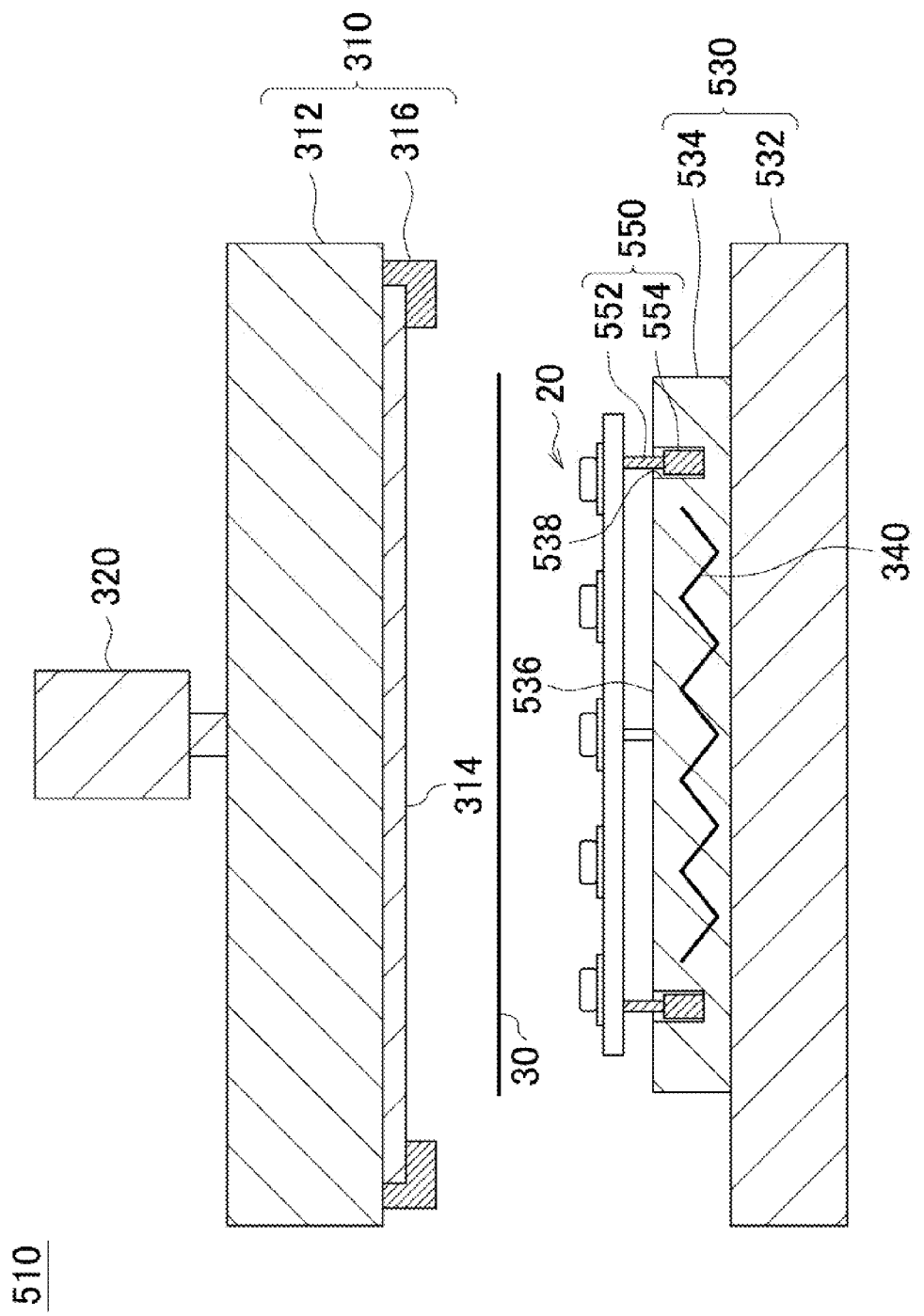
FIG. 5 schematically shows an exemplary cross section of the heating unit 510.

FIG. 5 schematically shows an exemplary cross section of the heating unit 510. The heating unit 510 may be another example of a heating device. The heating unit 510 includes the head 310, the drive section 320, a stage 530, the heater 340, and a floating jig 550. The stage 530 includes a platform 532 and a heating stage 534.

The heating stage 534 includes a heated surface 536 and a recessed portion 538. A floating jig 550 is arranged within the recessed portion 538. The floating jig 550 may include a support pin 552 and a raising/lowering member 554. The present embodiment describes an example in which the transport carrier 130 is not used, but instead, the transport carrier 130 may be used by the heating unit 510.

The platform 532, the heating stage 534, and the heated surface 536 correspond to the platform 332, the heating stage 334, and the heated surface 336 of the heating unit 110. The raising/lowering member 554 corresponds to the raising/lowering member 354 of the heating unit 110. Descriptions of components of the heating unit 510 that correspond to components of the heating unit 110 may be omitted.

The support pin 552 is supported by the raising/lowering member 554, and can move up and down in FIG. 5. When the raising/lowering member 554 moves the support pin 552 downward, the support pin 552 is housed in the recessed portion 538, and the top surface of the support pin 552 is positioned lower than the heated surface 536. When the raising/lowering member 554 moves the support pin 552 upward, the top surface of the support pin 552 is positioned higher than the heated surface 536.

The support pin 552 receives the workpiece 20 from the transport unit 120 in a state where the top surface of the support pin 552 is positioned higher than the heated surface 536. The support pin 552 holds the workpiece 20 between the head 310 and the heating stage 534. In this way, the support pin 552 thermally separates the heating stage 534 form the workpiece 20, and can hold the workpiece 20 between the head 310 and the heating stage 534.

When the drive section 320 moves the head 310 toward the stage 530, the raising/lowering member 554 moves the support pin 552 in the direction in which the head 310 moves. When the drive section 320 moves the stage 530 toward the head 310, the raising/lowering member 554 moves the support pin 552 in a direction opposite the direction in which the stage 530 moves.

When one of the head 310 and the heating stage 334 presses the workpiece 20 toward the other, the raising/lowering member 554 lowers the support pin 552 such that the workpiece 20 and the heating stage 534 contact each other. In this way, the workpiece 20 and the heating stage 534 are thermally connected. When the pressing force by the heating stage 534 or the head 310 is removed, the raising/lowering member 554 raises the support pin 552 to thermally separate the heating stage 534 form the workpiece 20.

Figure 6:
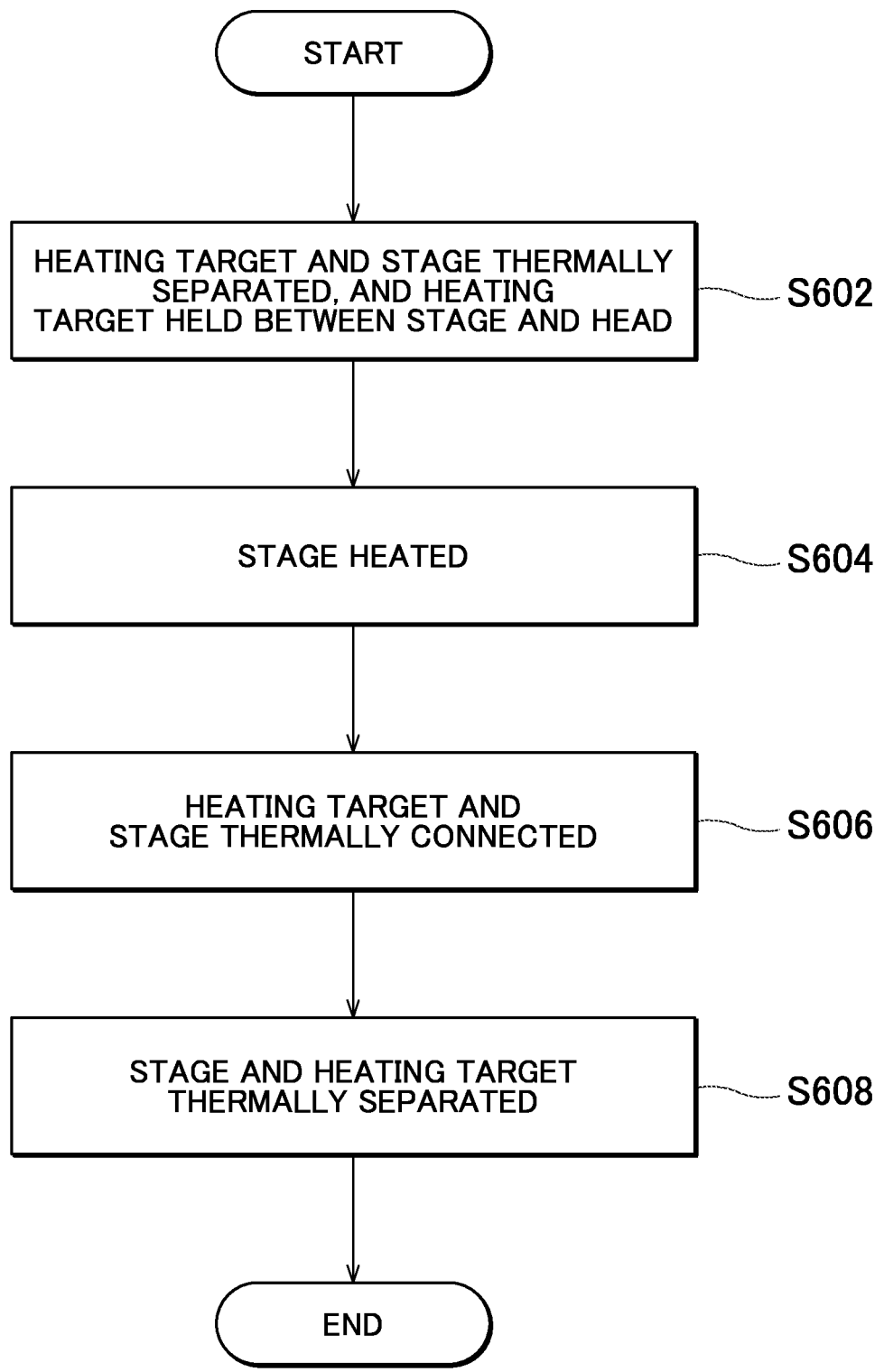
FIG. 6 is an exemplary flow chart of an implemented body manufacturing method.

FIG. 6 is an exemplary flow chart of an implemented body manufacturing method. The following describes an exemplary method for manufacturing an implemented body obtained by implementing a plurality of electronic components 26 on a substrate 22 using the heating unit 110. In the present embodiment, first, a workpiece 20 is prepared by layering the substrate 22, the adhesive layer 24, and the electronic components 26 in the stated order. The workpiece 20 is mounted on the transport carrier 130, and transported to the heating unit 110.

At S602, the holding member 352 receives the transport carrier 130, and the workpiece 20 is held between the heating stage 334 and the pressing member 314 of the head 310. At this time, the workpiece 20 and the heating stage 334 are thermally separated by the raising/lowering member 354.

At S604, the heater 340 heats the heating stage 334 to a temperature that causes the adhesive layer 24 of the workpiece 20 to harden, and maintains the heating stage 334 at this temperature. The heater 340 may heat the heating stage 334 to approximately 180° C. At this time, if the head body 312 includes a heater, this heater may maintain the head body 312 at a temperature of approximately 50° C.

At S606, the drive section 320 lowers the head 310, and the pressing member 314 presses the workpiece 20 toward the heating stage 334. The raising/lowering member 354 lowers the holding member 352, such that the transport carrier 130 contacts the heating stage 334. In this way, the workpiece 20 and the heating stage 334 are thermally connected to each other. The workpiece 20 is pressed and heated for a prescribed time with a prescribed pressure and temperature to implement the electronic components 26 on the substrate 22, thereby manufacturing the implemented body.

At S608, after the implementation, the drive section 320 raises the head 310 to remove the pressing force applied to the workpiece 20 by the pressing member 314. In this way, the raising/lowering member 354 raises the holding member 352 to thermally separate the heating stage 334 from the workpiece 20.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

List of Reference Numerals

10: cassette, 12: mounting member, 20: workpiece, 22: substrate, 24: adhesive layer, 26: electronic component, 30: protective film, 100: mounting device, 110: heating unit, 120: transport unit, 122: loader section, 124: moving section, 126: rail, 128: robot arm, 130: transport carrier, 310: head, 312: head body, 314: pressing member, 316: holding member, 320: drive section, 330: stage, 332: platform, 334: heating stage, 336: heated surface, 340: heater, 350: floating jig, 352: holding member, 354: raising/lowering member, 510: heating unit, 530: stage, 532: platform, 534: heating stage, 536: heated surface, 538: recessed portion, 550: floating jig, 552: support pin, 554: raising/lowering member

What is claimed is:

1. A heating apparatus comprising:
   a first pressing member that heats a heating target;
   a second pressing member that includes an elastic body and a first holding member that holds the elastic body; and
   a floating jig that includes a second holding member that holds the heating target between the first pressing member and the second pressing member, wherein
   one of the first pressing member and the second pressing member is operable to press the heating target in a first direction toward the other of the first pressing member and the second pressing member so as to sandwich the heating target between the first pressing member and the elastic body,
   the floating jig is i) operable to thermally separate the first pressing member from the heating target and ii) operable to thermally connect the heating target and the first pressing member when the one of the first pressing member and the second pressing member presses the heating target in the first direction, and,
   when the one of the first pressing member and the second pressing member presses the heating target in the first direction, the first holding member covers the second holding member such that the second holding member intervenes between the first pressing member and the first holding member in a second direction perpendicular to the first direction, thereby restricting positional skew of the floating jig in the second direction.

2. The heating apparatus according to claim 1, further comprising a heating section that heats the first pressing member and keeps the first pressing member at a predetermined temperature.

3. The heating apparatus according to claim 1, wherein
   when the pressing force by the first pressing member or the second pressing member is removed, the floating jig thermally separates the first pressing member from the heating target.

4. The heating apparatus according to claim 3, wherein
   the floating jig mechanically separates the heating target from the first pressing member, according to one of the first pressing member and the second pressing member separating from the other.

5. The heating apparatus according to claim 1, wherein
   the elastic body of the second pressing member presses an electronic component of the heating target, which is formed by layering a substrate, an adhesive layer, and the electronic component in the stated order, against the substrate.

6. The heating apparatus according to claim 5, wherein
   the elastic body of the second pressing member presses a plurality of the electronic components of the heating target, which is formed by layering the substrate, the adhesive layer, and the electronic components in the stated order, against the substrate.

7. The heating apparatus according to claim 1, further comprising:
   a plurality of carriers on which the heating target is mounted; and
   a transporting section that sequentially selects the carriers and causes the floating jig to hold the selected carriers.

8. The heating apparatus according to claim 7, wherein
   the second holding member holds one of the selected carriers such that a portion of the one of the selected carriers is exposed to a heated surface of the first pressing member, and
   the size of the portion is substantially the same as or greater than the size of the heated surface of the heating stage.

9. The heating apparatus according to claim 1, further comprising a drive section that moves the second pressing member toward and away from the first pressing member to apply and remove a pressing force on the heating target via the second pressing member.

10. The heating apparatus according to claim 9, the drive section includes an air cylinder, hydraulic cylinder, or servo motor.

11. The heating apparatus according to claim 1, further comprising a drive section that moves the first pressing member toward and away from the second pressing member to apply and remove a pressing force on the heating target via the first pressing member.

12. The heating apparatus according to claim 11, the drive section includes an air cylinder, hydraulic cylinder, or servo motor.

13. The heating apparatus according to claim 1, wherein
   the second pressing member sandwiches the heating target between the first pressing member and the elastic body such that the heating target is buried in the elastic body.

* * * * *